United States Patent
Dudzik

(10) Patent No.: US 8,018,221 B2
(45) Date of Patent: Sep. 13, 2011

(54) APPARATUS FOR MEASURING AN ELECTRIC CURRENT FLOWING THROUGH AN ELECTRICAL CONDUCTOR

(75) Inventor: Rainer Dudzik, Oberreichenbach (DE)

(73) Assignee: Robert Seuffer GmbH & Co. KG, Calw (DE)

( * ) Notice: Subject to any disclaimer, the term of this patent is extended or adjusted under 35 U.S.C. 154(b) by 383 days.

(21) Appl. No.: 12/020,046

(22) Filed: Jan. 25, 2008

(65) Prior Publication Data

US 2008/0180096 A1 Jul. 31, 2008

(30) Foreign Application Priority Data

Jan. 25, 2007 (DE) .......................... 10 2007 003 830

(51) Int. Cl.
*G01R 15/18* (2006.01)
(52) U.S. Cl. .................................. 324/117 R
(58) Field of Classification Search .............. 324/117 H, 324/117 R, 115, 126–127, 158.1, 252
See application file for complete search history.

(56) References Cited

U.S. PATENT DOCUMENTS

| | | | |
|---|---|---|---|
| 6,278,271 B1 | 8/2001 | Schott | |
| 6,304,082 B1 * | 10/2001 | Gualtieri et al. | 324/252 |
| 6,853,179 B2 * | 2/2005 | Buchhold | 324/117 R |
| 7,545,136 B2 * | 6/2009 | Racz et al. | 324/117 H |
| 7,579,825 B2 * | 8/2009 | Hausperger et al. | 324/117 H |
| 2003/0017753 A1 | 1/2003 | Palmisano et al. | |
| 2006/0290341 A1 | 12/2006 | Hausperger et al. | |

FOREIGN PATENT DOCUMENTS

| | | |
|---|---|---|
| CN | 1179212 (A) | 4/1998 |
| CN | 1346441 (A) | 4/2002 |
| DE | 10 2005 024 075 A1 | 11/2006 |
| EP | 0 521 250 A2 | 1/1993 |
| EP | 0 947 846 A2 | 10/1999 |
| EP | 0 947 846 B1 | 10/1999 |
| JP | 3-229161 A | 10/1991 |

OTHER PUBLICATIONS

German Office Action including English translation dated Aug. 26, 2008 (Seven (7) pages).
German Search Report dated Nov. 4, 2010 with English translation (Seven (7) pages).
M. Paranjape and I. Filanovsky: "A 3-D Vertical Hall Magnetic-Field Sensor in CMOS Technology", 8253a Sensors and Actuators, Elsevier Sequoia, A Physical, A34 Jul. 1992, No. 1, Lausanne, CH, 9-14.
Chinese Office Action dated Nov. 11, 2010 (English translation) (Eight (8) pages).
Wang Hongxia et al.: "Application of Nanocrystalline Alloy in Cores of Measuring Current Transformer", The National Amorphous & Nanocrystalline Alloy Engineering Research Center, (1999) April, vol. 36, No. 4, Beijing, CN, p. 42-46.

* cited by examiner

*Primary Examiner* — Huy Phan
*Assistant Examiner* — Trung Q Nguyen
(74) *Attorney, Agent, or Firm* — Crowell & Moring LLP

(57) ABSTRACT

An apparatus for measuring an electric current flowing through an electrical conductor (1), comprising a measuring device which detects a magnetic field formed by the electrical conductor in three orthogonal spatial directions and supplies measurement signals associated with the respective spatial directions.

9 Claims, 2 Drawing Sheets

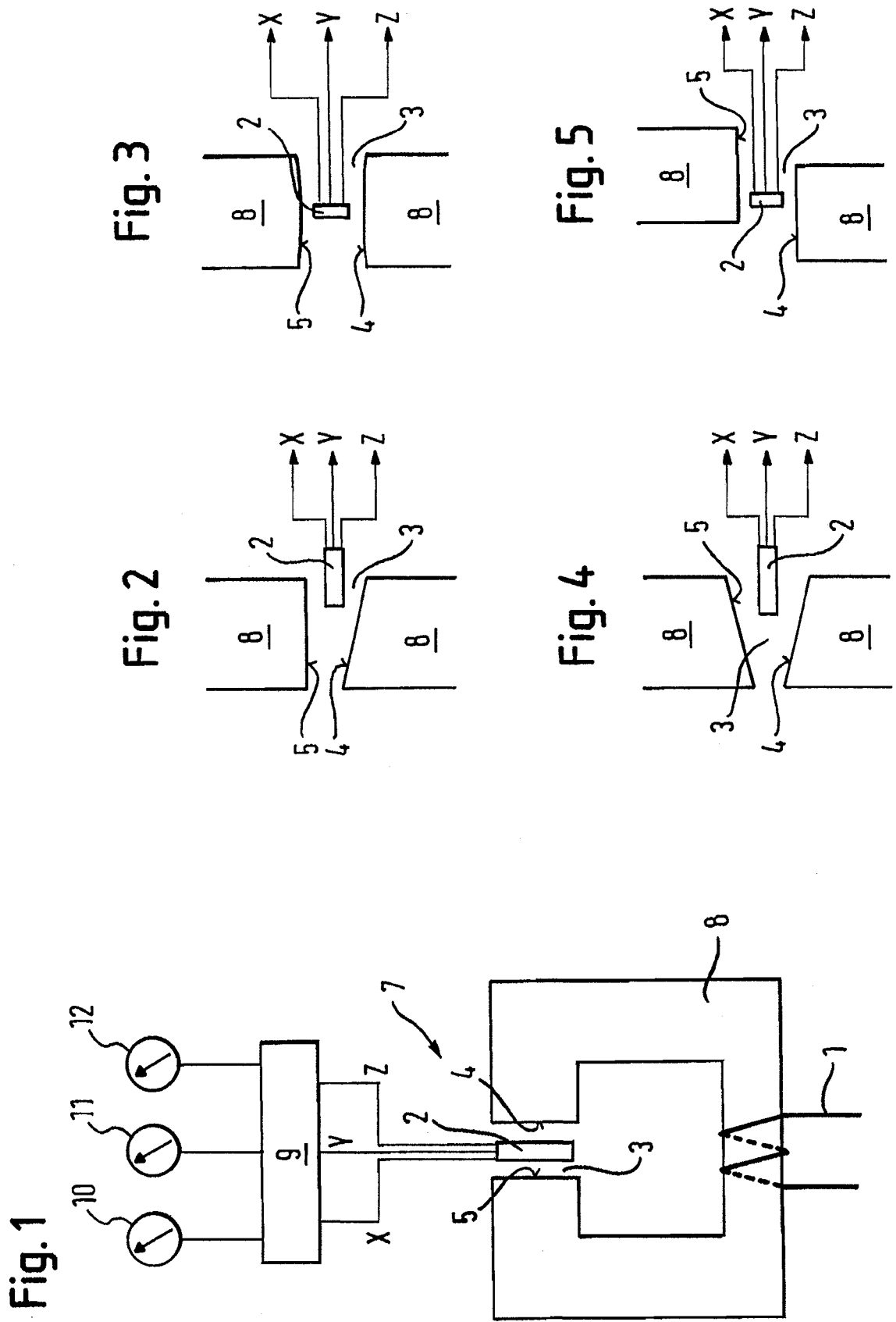

APPARATUS FOR MEASURING AN ELECTRIC CURRENT FLOWING THROUGH AN ELECTRICAL CONDUCTOR

The invention concerns an apparatus for measuring an electric current flowing through an electrical conductor, comprising a measuring device which is arranged in the proximity of the electrical conductor and which detects the magnetic field generated by the electric current and supplies an electrical signal corresponding to the current strength.

For contactlessly detecting a current flowing in an electrical conductor, it is known to use magnetic field-sensitive sensors, in particular in current overload protection devices (DD 257 719 A1).

The object of the invention is to provide an apparatus of the kind set forth in the opening part of this specification, in which precise measurement of the electric current flowing in the electrical conductor is achieved.

That object is attained by the features recited in claim 1. The appendant claims recite advantageous developments of the invention.

The invention involves the use of a measuring device which is arranged in the proximity of the electrical conductor and which can detect the magnetic field generated by the conductor through which the current flows, in three orthogonal spatial directions. For that purpose the magnetic sensor device has magnetic field-sensitive transducers or sensors associated with the three orthogonal spatial directions. They deliver electrical signals which are proportional to the three orthogonal field strength components of the magnetic field.

Preferably the measuring device has at least one core of magnetic material with at least one air gap, in which a magnetic field corresponding to the current strength is generated. The magnetic sensor device is arranged in the at least one air gap or in the proximity of the air gap for detecting the magnetic field generated.

A homogeneous or non-homogeneous magnetic field can be generated in the air gap by virtue of a suitable configuration of the boundary surfaces defining the air gap.

In that respect it is possible for the magnetic field strengths respectively measured in the orthogonal spatial directions to be associated with measuring regions involving different measurement sensitivities. In addition it is possible for measuring devices to be arranged in a plurality of air gaps and for the respective measuring devices to be associated with measuring regions involving different measurement sensitivities. It is also possible for different regions of the magnetisation curve of the magnetic material to be associated with measuring regions involving differing measurement sensitivity. It is possible to provide cores which have a plurality of air gaps. It is however also possible to provide a plurality of cores, between which a plurality of air gaps are formed. Cores of different magnetic materials can also be provided. In that respect, the respective core can have at least one air gap and at least one air gap can be formed between the cores. With that arrangement, it is also possible to provide in the air gaps or in the proximity of the air gaps measuring devices which are associated with the different measuring regions. The current-carrying electrical conductor or the current-carrying electrical conductors can be passed through bores and/or openings in the at least one core. It is also possible to pass the conductor around the core or around projections provided on the core or another core portion.

Preferably the apparatus is so designed that it is suitable for fixing to a current connecting element, in particular to a cable clamp or connecting terminal for battery poles in vehicles.

The magnetic sensor device includes magnetic field-sensitive transducers which are associated with the orthogonal spatial directions, for example magnetoresistive transducers, Hall elements, magnetotransistors or the like.

The invention will now be described in greater detail by means of embodiments by way of example with reference to the Figures in which:

FIG. 1 is a diagrammatic view of an embodiment of the invention,

FIGS. 2 to 5 show air gaps of different shapes in the magnetic circuit of the embodiment of FIG. 1.

Figure 7:
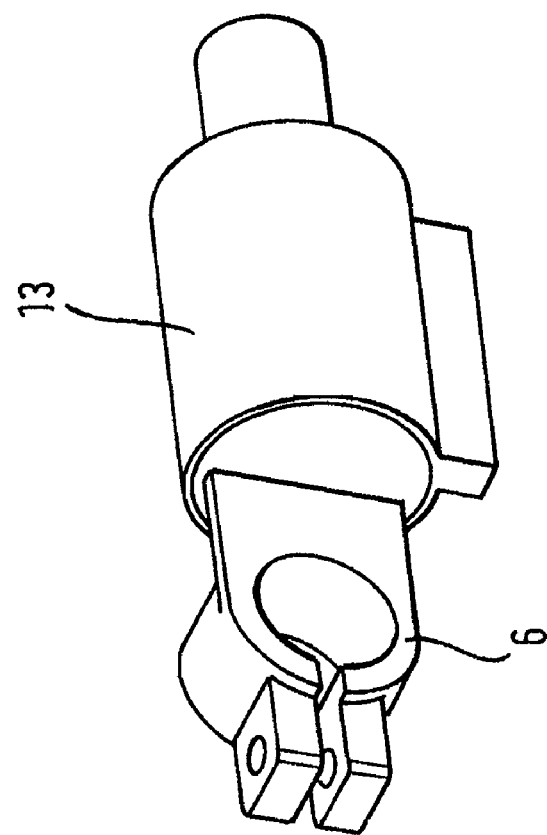
FIG. 7 shows a pole connecting terminal clamp with incorporated embodiment.

FIG. 1 diagrammatically shows an embodiment of the invention. This embodiment includes a magnetic circuit 8 formed by a core of magnetic material. It is possible to use magnetically hard or soft materials, in particular ferrites, as the magnetic material for the magnetic circuit 8. The magnetic circuit is shown as being rectangular in FIG. 1. It is also possible to use ring cores for forming the magnetic circuit. Instead of a simple magnetic circuit, it is also possible to use branched magnetic circuits.

The magnetic circuit 8 in the illustrated embodiment has an air gap 3. There may also be two or more air gaps in the magnetic circuit. The respective air gap 3 is defined by boundary surfaces 4 and 5. Homogeneous or non-homogeneous magnetic fields can be formed in the air gap 3 by virtue of a suitable configuration of the boundary surfaces 4 and 5. The magnetic field formed in the respective air gap 3 is proportional to a current, in particular a direct current, which flows in an electrical conductor 1. The magnetic circuit 8 is arranged in the proximity of that electrical conductor 1 in such a way that the field lines of the magnetic field formed by the electrical conductor 1 pass through the magnetic circuit 8. In the illustrated embodiment the electrical conductor 1 extends around a limb of the magnetic circuit 8 in the form of a coil. When using a ring core for forming the magnetic circuit, the electrical conductor 1 can be passed through a bore in the ring core. It is also possible for the conductor 1 to be arranged in openings, in particular in openings in the ring core, in the form of a loop or coil.

A substantially homogeneous magnetic field can be generated in the interior of the air gap 3 by means of flat boundary surfaces 4 and 5 which extend in mutually parallel relationship. At the edge of the air gap 3 the magnetic field is non-homogeneous and the field lines are of a curved configuration.

Preferably a non-homogeneous magnetic field is formed in the air gap 3. For that purpose the boundary surfaces 4 and 5 can involve different shapes. In the embodiment of FIG. 2 one of the two boundary surfaces is arranged inclinedly with respect to the other boundary surface. In the FIG. 3 embodiment the boundary surfaces 4 and 5 are of a curved, in particular part-spherical shape, in which respect, in place of the convex curvature shown in FIG. 3, it is also possible to employ a concave curvature.

In the embodiment of FIG. 4 the two boundary surfaces 4 and 5 are arranged inclinedly with respect to the central plane of the air gap 3. In the embodiment of FIG. 5 the two flat boundary surfaces 4 and 5 are arranged in mutually displaced relationship. Depending on the respective purpose of use it is also possible to employ different shapes for the boundary surfaces, in which respect combined use of the arrangements shown in FIGS. 2 to 5 can also be involved.

For forming the magnetic circuit 8 it is possible to use cores of different magnetic materials. The respective air gap 3 can be formed in the core material or between adjacent cores.

In the current measuring device 7, arranged in the air gap 3 is a magnetic sensor device 2 which detects the magnetic field in three orthogonal spatial directions (X Y Z). For that purpose the magnetic sensor device has magnetic field-sensitive transducers or sensors associated with the three orthogonal spatial directions (X Y Z). Each of those sensors generates an electrical signal which is proportional to the magnetic field component in the spatial direction associated therewith. Those signals are passed to an evaluation device 9, in particular an electronic evaluation device, for example a microprocessor. It evaluates the electrical signals and forms display signals for display devices 10, 11 and 12. Those display devices can provide displays associated with the three orthogonal spatial directions.

Preferably the magnetic field sensor device 2 is arranged in a non-homogeneous magnetic field region of the air gap 3. As already mentioned hereinbefore the air gap or gaps can be of such a configuration that non-homogeneous magnetic fields are generated. If the display devices 10, 11 and 12 are associated with the respective spatial directions (X Y Z) of the field strength components, different measurement values are indicated in the display devices for the current flowing in the electrical conductor 1. Upon a change in the current flowing in the electrical conductor different changes also occur in the display devices 10, 11 and 12. That results from the fact that, upon a change in current, the changes in the field strength components, which are in the respective spatial directions, of the magnetic field, at the location of the associated transducers or sensors of the magnetic sensor device 2, change in different ways. Therefore, different current sensitivities are involved in respect of the measurement values and the respective displays for those measurement values, for the measurements in the three spatial directions.

When the plurality of air gaps are defined by different magnetic materials at the boundary surfaces 4 and 5, different measurement sensitivities can also be caused in the case of changes in current strength of the electric current flowing in the electrical conductor 1. It is possible for the display with the respectively desired measurement sensitivity to be switched on.

Figure 6:
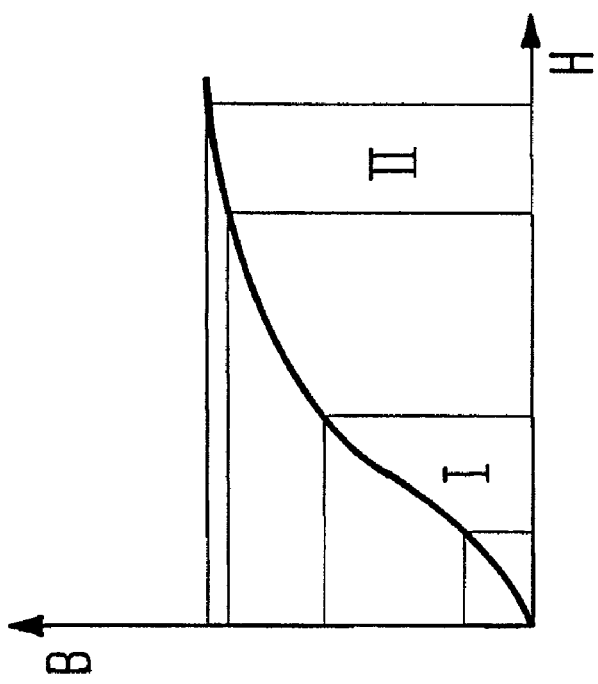
FIG. 6 shows an example of a magnetisation curve for a material of the magnetic circuit.

It is also possible for the current measurement operations to be carried out in different regions of the magnetisation curve. By way of example, an only relatively slight change in the magnetic field strength is achieved in a region (I) in the case of a relatively great change in current and a thus related change in magnetic flux. When approaching the saturation region the magnetisation curve is shallower so that a relatively slight change in current in the region (II) causes a great change in magnetic field, as can be seen from FIG. 6.

FIG. 7 shows a pole connecting terminal clamp 6 for a current supply cable, which is to be connected to a battery terminal of a vehicle battery. An embodiment of the invention is incorporated in a housing 13 and fixed to the pole connecting terminal clamp 6. This embodiment is representative of further possible uses of the apparatus according to the invention in relation to arrangement in the immediate proximity of conductors through which current flows and the current strength of which is to be measured. As the embodiment shows the apparatus according to the invention can be fixed in a housing, in particular in the region of current connecting elements.

LIST OF REFERENCES

1 electrical conductor
2 magnetic sensor device
3 air gap
4 boundary surface
5 boundary surface
6 pole connecting terminal clamp
7 electric current measuring device
8 magnetic circuit
9 evaluation device
10-12 display devices
13 housing

The invention claimed is:

1. An apparatus for measuring an electric current flowing through an electrical conductor, comprising a measuring device which is arranged in the proximity of the electrical conductor and which detects the magnetic field generated by the electric current and supplies an electrical signal corresponding to the current strength, characterised in that the measuring device has a magnetic sensor device detecting the magnetic field in three orthogonal spatial directions, wherein the magnetic sensor device has magnetic field-sensitive transducers or sensors associated with the three orthogonal spatial directions, wherein measuring regions of different measurement sensitivities are associated with the various regions of the saturation curve of the respective magnetic material of the at least one magnetic circuit.

2. Apparatus according to claim 1, wherein the measuring device has a least one magnetic core or magnetic material with an air gap, and wherein the magnetic sensor device is arranged in the at least one air gap or in the proximity of the air gap for detecting the magnetic field present in the air gap or in the proximity of the air gap.

3. Apparatus according to claim 2, wherein the surfaces, defining the air gap, are boundary surfaces and for generating a homogeneous magnetic field in the air gap.

4. Apparatus according to claim 2, wherein the boundary surfaces defining the air gap generate a non-homogeneous magnetic field in the air gap.

5. Apparatus according to claim 2, wherein the current-carrying electrical conductor is passed through bores and/or openings or around projections of the at least one core.

6. Apparatus according to claim 1, wherein a plurality of magnetic sensor devices associated with various measuring regions involving different measurement sensitivities are provided in or in the proximity of a plurality of air gaps.

7. Apparatus according to claim 1, wherein there are provided two or more cores for forming the magnetic circuit and one or more air gaps are formed between the cores.

8. Apparatus according to claim 7, wherein the cores are formed from different magnetic materials.

9. Apparatus according to claim 1, wherein the apparatus is configured for fixing to a current connecting element, including a cable clamp or a pole connecting terminal clamp as may be used for vehicle batteries.

* * * * *